(12) United States Patent
Wan et al.

(10) Patent No.: US 10,672,658 B2
(45) Date of Patent: Jun. 2, 2020

(54) SEMICONDUCTOR DEVICE AND METHOD OF FORMING THE SAME (71) Applicant: UNITED MICROELECTRONICS CORP., Hsin-Chu (TW)

(72) Inventors: Wen-Wu Wan, Kaohsiung (TW); Tien-Hsiang Cheng, Tainan (TW); Kun-Hsuan Chung, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/116,949

(22) Filed: Aug. 30, 2018

(65) Prior Publication Data
US 2020/0035557 A1 Jan. 30, 2020

(30) Foreign Application Priority Data
Jul. 27, 2018 (CN) .......................... 2018 1 0843512

(51) Int. Cl.
H01L 27/088 (2006.01)
H01L 21/768 (2006.01)
H01L 29/423 (2006.01)
H01L 21/8234 (2006.01)
H01L 29/40 (2006.01)

(52) U.S. Cl.
CPC .. *H01L 21/76897* (2013.01); *H01L 21/76895* (2013.01); *H01L 21/823475* (2013.01); *H01L 27/088* (2013.01); *H01L 29/401* (2013.01); *H01L 29/42364* (2013.01)

(58) Field of Classification Search
CPC ........................ H01L 27/088; H01L 21/76897
See application file for complete search history.

(56) References Cited

U.S. PATENT DOCUMENTS

| 6,110,811 A * | 8/2000 | Pey ................... H01L 21/28052 257/E21.165 |
| 6,287,951 B1 | 9/2001 | Lucas et al. |
| 9,728,454 B1 | 8/2017 | Zhou et al. |
| 9,754,828 B1 | 9/2017 | Zhou et al. |
| 10,090,321 B2 * | 10/2018 | Nakajima ........... H01L 27/1157 |

* cited by examiner

*Primary Examiner* — Mark V Prenty
(74) *Attorney, Agent, or Firm* — Winston Hsu (57) ABSTRACT

The present invention relates to a semiconductor device and a method of forming the same, the semiconductor device includes a substrate, a gate structure, an insulating stacked structure and a first conductive layer. The gate structure is disposed on the substrate, and the insulating stacked structure covers the gate structure and the substrate to define a first opening therein to expose a portion of the gate structure and a portion of the substrate. The first conductive layer covers surfaces of the first opening to directly contact the portion of the substrate and the portion of the gate structure, with the first conductive layer including two outer extension wings on a top surface of the insulating stacked structure.

12 Claims, 12 Drawing Sheets

ND METHOD
SEMICONDUCTOR DEVICE AND METHOD OF FORMING THE SAME

BACKGROUND OF THE INVENTION

1. Field of the Invention

The present invention relates generally to a semiconductor device and a method of forming the same and more particularly, to a semiconductor device having a pre-plug conductive layer to configure as a portion of the interconnection system thereof, and a method of forming the same.

2. Description of the Prior Art

Semiconductor integrated circuits are one of the most important hardware bases in the modern information society. A key design point of the semiconductor industry is to increase integration of integrated circuits, and therefore to use the area of integrated circuits more efficiently. Generally speaking, integrated circuits having complex functions are made up of many standard cells, each with basic functions. However, it is found that valuable areas in the elements with cells of multi-heights are always wasted and complexities of circuit design and manufacturing processes are both increased. Therefore, an integrated circuit layout structure that is able to comply with requirements of superior space utilization efficiency is still needed.

SUMMARY OF THE INVENTION

One object of the present invention is to provide a semiconductor device and a method of forming the same, in which, the semiconductor device has a pre-plug conductive layer which is configured as a primary interconnection system of the semiconductor device, so as to effectively shrink the device layout. Thus, it is sufficient to forma more reliable semiconductor device under a shrunk cell size by disposing a plug with an improved structure on the conductive layer.

To achieve the purpose described above, the present invention provides a semiconductor device including a substrate, a gate structure, an insulating stacked structure and a first conductive layer. The gate structure is disposed on the substrate, and the insulating stacked structure partially covers the gate structure and the substrate to expose a portion of the gate structure to define a first opening. The first conductive layer covers surfaces of the first opening to directly contact the portion of the gate structure, wherein the first conductive layer comprises two outer extension wings disposed on a top surface of the insulating stacked structure.

To achieve the purpose described above, the present invention provides a method of forming a semiconductor device including the following steps. Firstly, a substrate is provided, and a gate structure is formed on the substrate. Next, an insulating stacked structure is conformally formed on the substrate, covering the gate structure and the substrate. Then, a first opening is formed in the insulating stacked structure to expose a portion of the gate structure. Following these, a first conductive layer is formed on surfaces of the first opening to directly contact the portion of the gate structure, wherein the first conductive layer comprises two outer extension wings on a top surface of the insulating stacked structure.

Overall, since the semiconductor device of the present invention utilizes a pre-plug conductive layer to forma preliminary interconnection system, the cell size of the semiconductor device may be sufficiently shrunk. Also, the present forming process of the present invention further improve the plug forming process under such semiconductor device with shrunk layout, which may not only avoid the possible impacts of the plug forming process especially on the process window thereof, but also has advantages to form plugs with a preferable structure, so as to obtain a more reliable semiconductor device thereby.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 are schematic diagrams illustrating a method of forming a semiconductor device according to a first preferred embodiment of the present invention, wherein:

FIG. 8 to FIG. 10 are schematic diagrams illustrating a method of forming a semiconductor device according to a second preferred embodiment of the present invention, wherein:

DETAILED DESCRIPTION

To provide a better understanding of the present invention, preferred embodiments will be described in detail. The preferred embodiments of the present invention are illustrated in the accompanying drawings with numbered elements.

Figure 1:
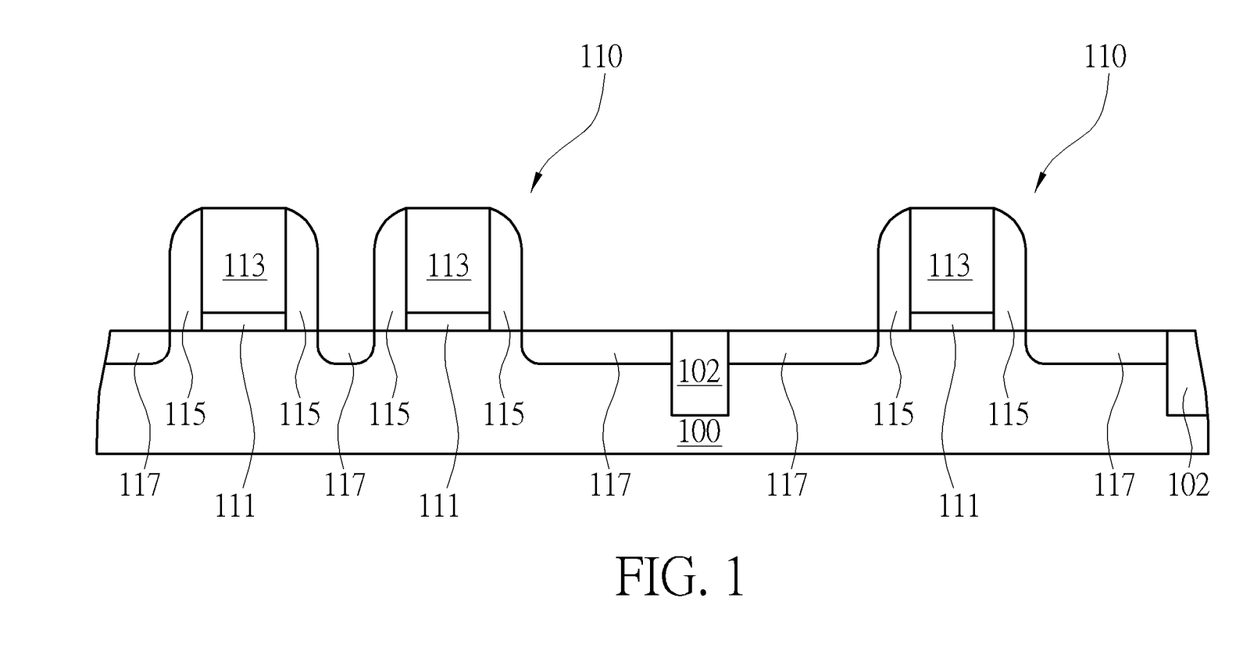
FIG. 1 shows a cross-sectional view of a semiconductor device at the beginning of the forming process.

Referring to FIGS. 1-7, FIGS. 1-7 illustrate a method of forming a semiconductor device according to the first preferred embodiment of the present invention. Firstly, a substrate 100 such as a silicon substrate, an epitaxial silicon substrate or a silicon-on-insulator (SOI) substrate is provided, and at least one gate structure 110 is formed on the substrate 100, for example three gate structures 110 parallel disposed on the substrate 100 as shown in FIG. 1. The three gate structures 110 are preferably disposed within different pitches, so that, a portion of the gate structures 110 is disposed within a relative smaller pitch (for example the gate structures as shown in a left side of FIG. 1) and another portion of the gate structures 110 is disposed within a relative greater pitch (for example the gate structures as shown in a right side of FIG. 1). However, the practical arrangement of the gate structures 110 is not limited thereto, and which may further be modified based on the practical requirements of the semiconductor device, by further adjusting the location and the pitch of each gate structure.

In one embodiment, a shallow trench isolation (STI) 102 may be firstly formed in the substrate 100, to define a plurality of active areas (AA, not shown in the drawings) on the substrate 100. The active areas are respectively extended along a horizontal direction (not shown in the drawings), and which may be defined rather on a planar substrate or on fins (not shown in the drawings), with the gate structures 110 formed subsequently across the planar substrate or the fins. Each of the gate structures 110 includes a gate dielectric layer 111 and a gate layer 113 disposed on the substrate 100, and a spacer 115 surrounding the gate dielectric layer 111 and the gate layer 113. The gate layer 113 may optionally include polysilicon to let each gate structure 110 to configure as a polysilicon gate structure, or include a metal material to let each gate structure 110 to configure as a metal gate structure. Also, two source/drain regions 117 are formed in the substrate 100, at two sides of each gate structure 110. Since two gate structures 110 disposed at the left side of the substrate 100 have a relative smaller pitch, the source/drain region 117 disposed between these two gate structures 100 is namely shared thereby, as shown in FIG. 1.

Figure 2:
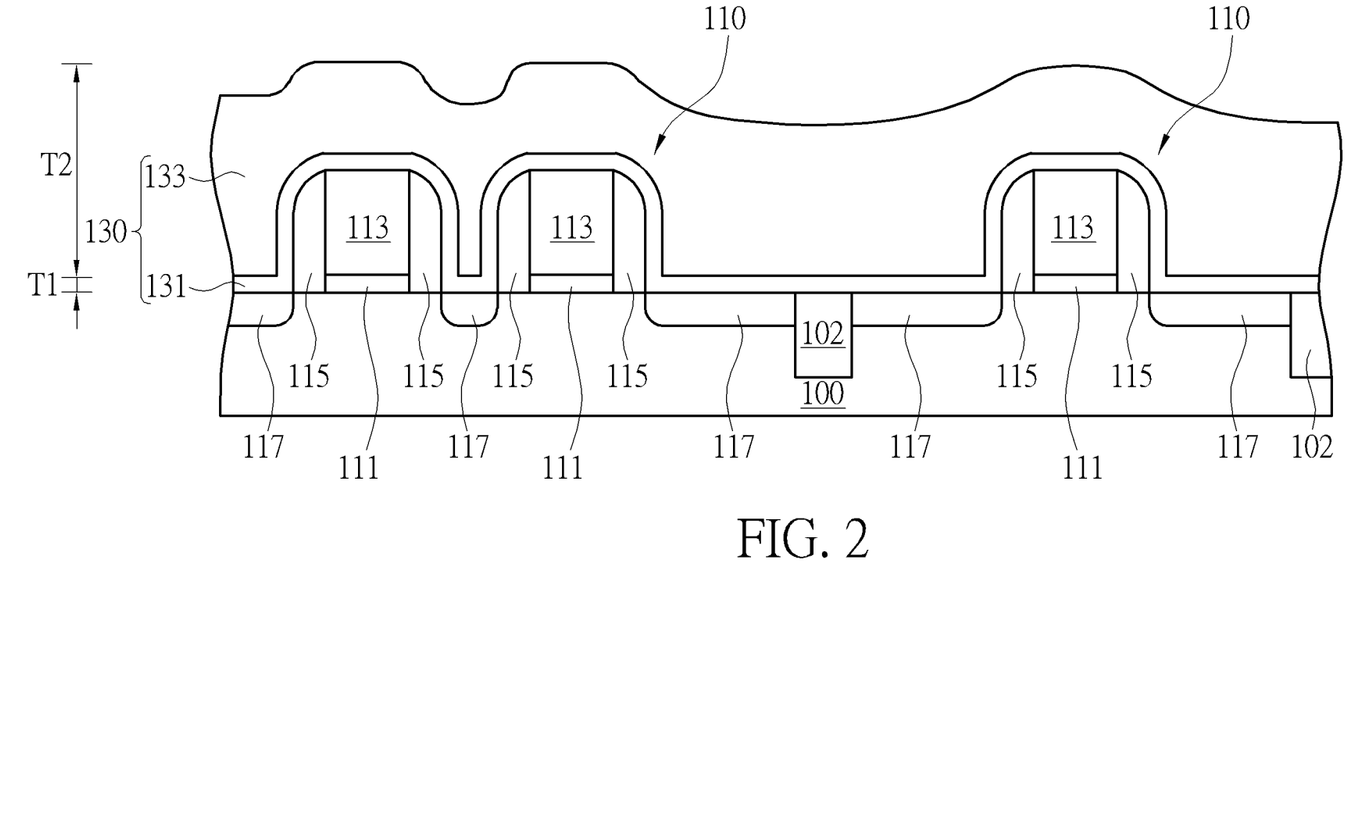
FIG. 2 shows a cross-sectional view of a semiconductor device after forming an insulating layer.
Figure 3:
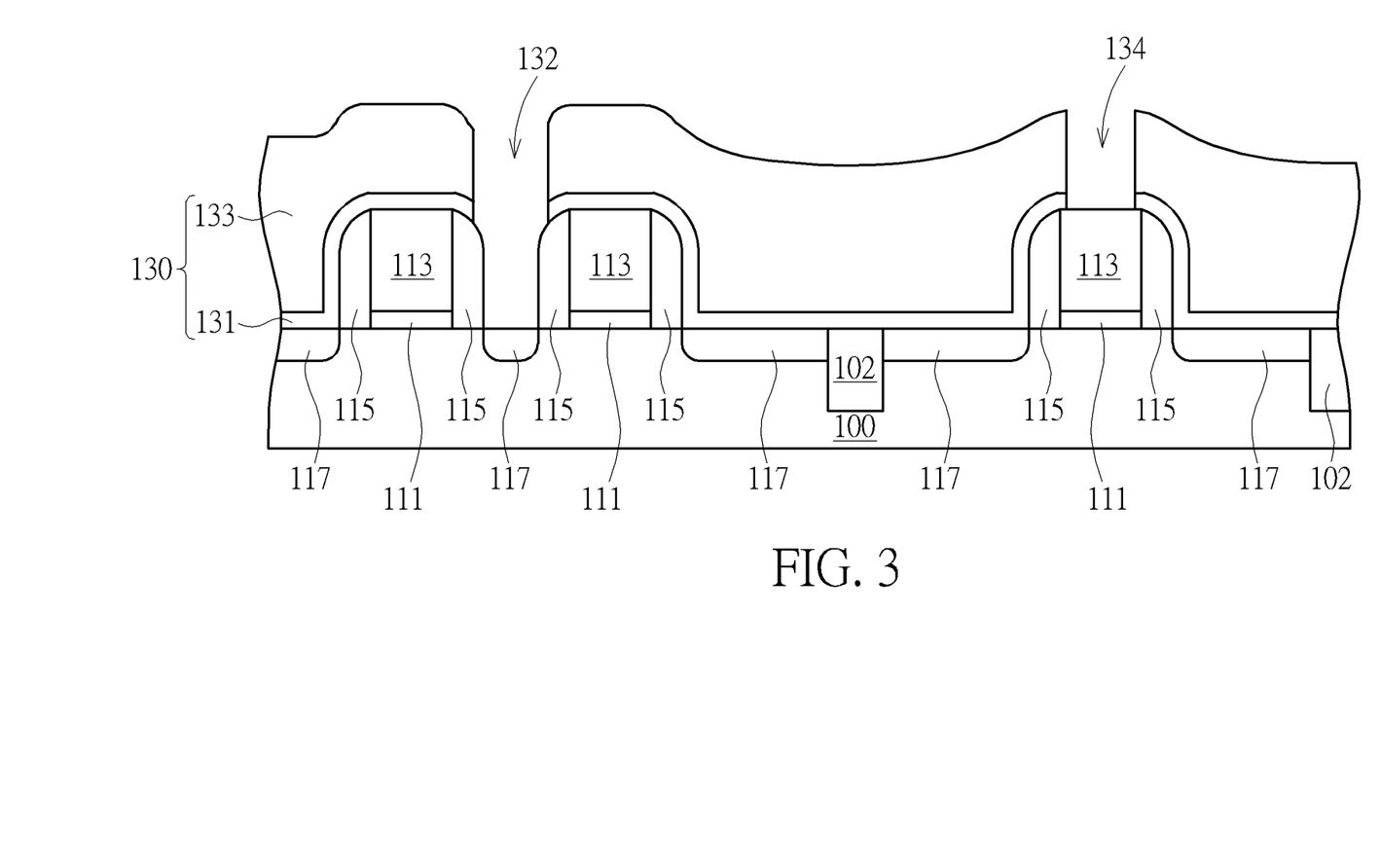
FIG. 3 shows a cross-sectional view of a semiconductor device after forming an insulating stacked structure.

Next, an insulating stacked structure 130 is formed on the substrate 100, the insulating stacked structure 130 preferably includes a multilayer structure for example including sequentially stacked two films as shown in FIGS. 2-3, but is not limited thereto. Precisely speaking, after forming the gate structures 110 and the source/drain regions 117 disposed at two sides thereof, insulating layers 131, 133 are sequentially formed on the substrate 100. The insulating layers 131, 133 preferably include different materials with a greater etching selectivity. For example, in one embodiment, the insulating layer 131 may include silicon nitride (SiN) or silicon oxynitride (SiON), and which conformally covers the substrate 100 and each gate structure 110. The insulating layer 133 may include silicon oxide ($SiO_x$) or other dielectric layer with a preferably filling ability, and which conformally covers the first insulating layer 131, as shown in FIG. 2.

It is noted that, a significant height difference is formed on the substrate due to the formation of the gate structures 110, and also, the smaller pitch, compact layout of the gate structures 110 disposed on the left side of the substrate 100 further intensifies the high aspect ratio between the gate structures 110 and the substrate 100. Under this situation, while the insulating layers 131, 133 are conformally formed, surfaces of the insulating layers 131, 133 may also obtain uneven profile with the height difference of the elements underneath. Thus, in the present embodiment, the insulating layer 133 preferably includes a thickness T2 being greater than a thickness T1 of the insulating layer 131, such as being about 5 to 8 times greater than the thickness T1 of the insulating layer 131 as shown in FIG. 2, but not limited thereto.

After that, a mask layer (not shown in the drawings) is formed on the insulating layers 131, 133, to pattern the insulating layers 131, 133 through the mask layer, to expose a portion of the gate structures 110 and/or a portion of the substrate 100 to form the insulating stacked structure 130. Generally, the expose portions of the insulating stacked structure 130 (such as a portion of the substrate 100 and/or the gate structures 110) may be arranged according to the practical layout of the interconnection system of the semiconductor device. For example, the elements which are intended to be in connection with each other, such as the source/drain regions 117 of each gate structure 110, or the elements disposed within a compact layout which are intended to be connected to a region within a uncompact layout, are optionally exposed thereby for facilitating the formation of plugs in the subsequent processes. In the present embodiment, an opening 132 is formed in the insulating layers 131, 133 through the mask layer to expose a portion of the gate structures 110 (namely the spacer 115 of one gate structure 110) and the shared source/drain region 117 (namely a portion of the substrate 100) between the two gate structures 110, and another opening 134 is also formed in the insulating layers 131, 133 through the mask layer to expose the gate layer 113 of another gate structure 110, as shown in FIG. 3.

Figure 4:
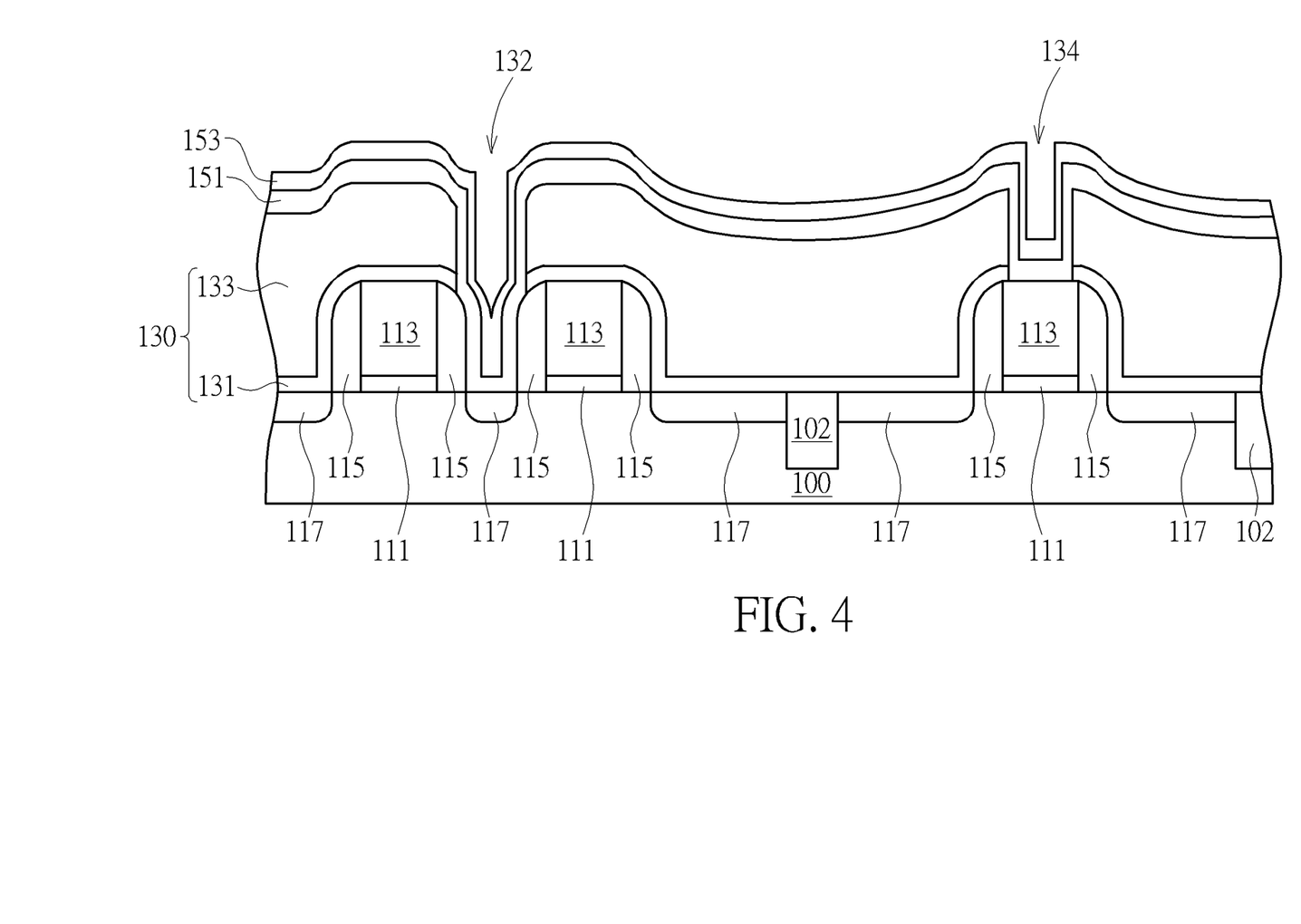
FIG. 4 shows a cross-sectional view of a semiconductor device after forming a conductive layer.
Figure 5:
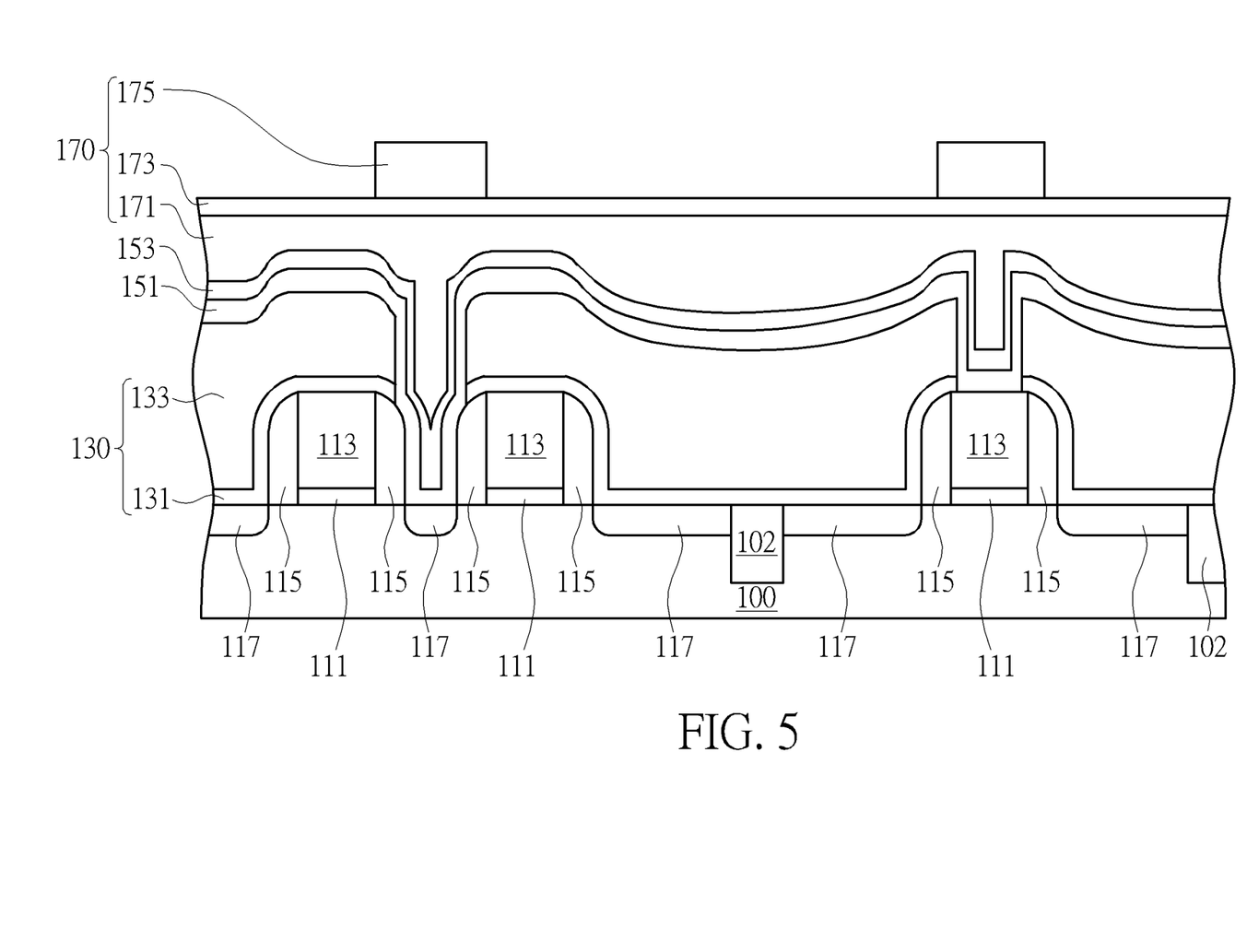
FIG. 5 shows a cross-sectional view of a semiconductor device after forming a mask layer.

Then, a plurality of conductive stacked structures 150 is formed on the top surface of the insulating stacked structure 130. The conductive stacked structure 150 also includes a multilayer structure for example including at least two films as shown in FIGS. 4-5, but is not limited thereto. Precisely speaking, after forming the insulating stacked structure 130, a conductive layer 151 and a material layer 153 are sequentially formed on the top surface of the insulating stacked structure 130 conformally, and surfaces of the conductive layer 151 and the material layer 153 may also obtain an uneven profile thereby. The conductive layer 151 uniformly covers surfaces of the insulating stacked structure 130 and the openings 132, 134, to directly contact the exposed source/drain region 117 or the exposed gate layer 113, and the material layer 153 covers the conductive layer 151, to at least fill up in the bottom of the opening 132 due to the smaller aperture size at the bottom of the opening 132, as shown in FIG. 4. In one embodiment, the conductive layer 151 for example includes a metal material like titanium (Ti), titanium nitride (TiN), or tungsten (W), and the material layer 153 for example includes an insulating material like silicon nitride or silicon oxynitride, but not limited thereto.

Figure 6:
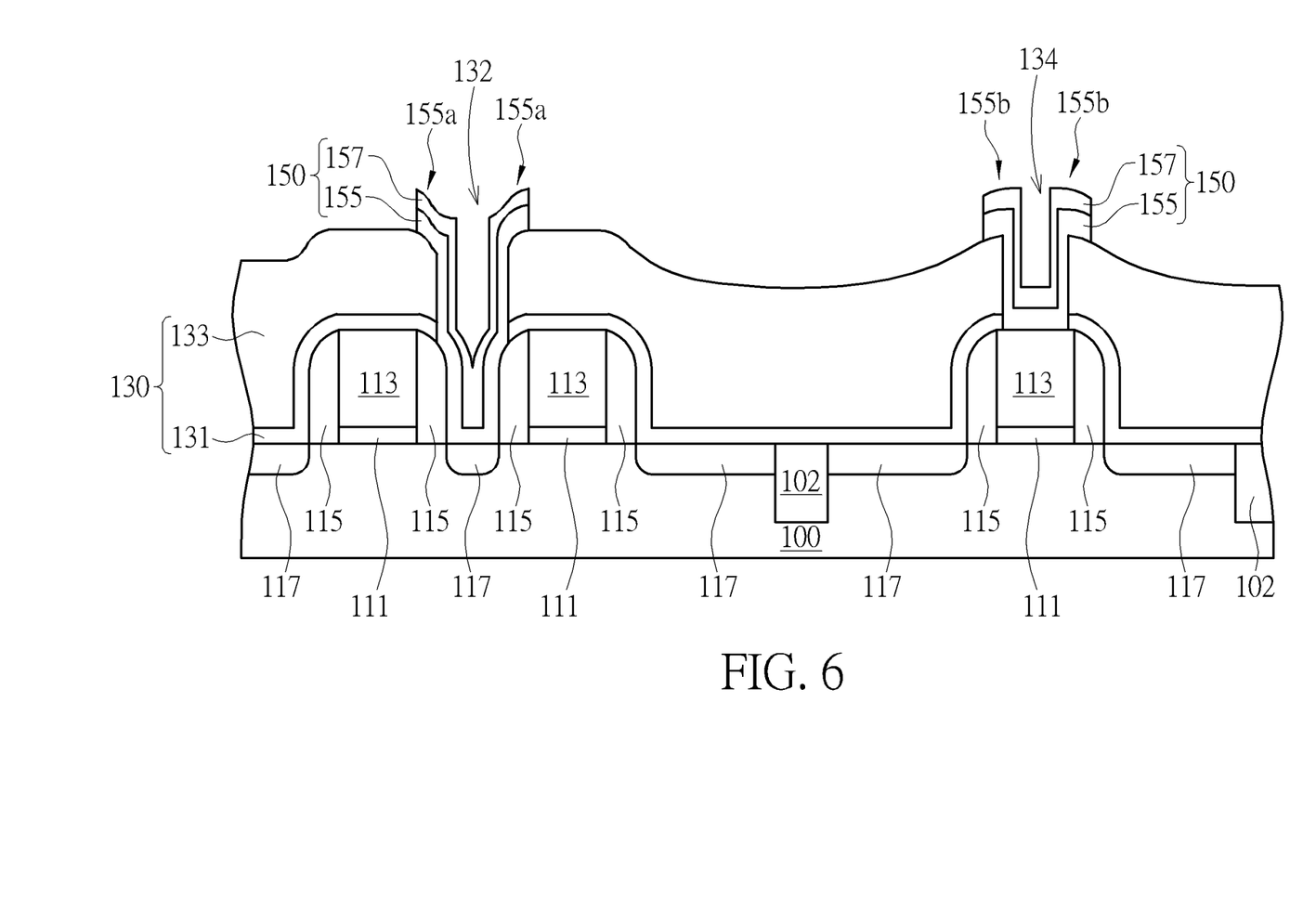
FIG. 6 shows a cross-sectional view of a semiconductor device after performing a patterning process.

A mask structure 170 is then formed on the material layer 153 to perform a patterning process. The mask structure 170 also includes a multilayer structure for example including a sacrificial layer 171, an anti-reflection layer 173 and a patterned mask layer 175 from bottom to top, with the planar sacrificial layer 171 firstly covering the material layer 153 and the conductive layer 151 entirely to fill in the uneven surfaces of the material layer 153, followed by forming the anti-reflection layer 173 and the patterned mask layer 175 on the sacrificial layer 171, as shown in FIG. 5. The patterned mask layer 175 includes a plurality of mask patterns which are defined at positions corresponding to the openings 132, 134 underneath, so that, the patterning process is performed through the patterned mask layer 175 to sequentially transfer the mask patterns into the anti-reflection layer 173, the sacrificial layer 171, the material layer 153 and the conductive layer 151 underneath, to completely removing the anti-reflection layer 173, the sacrificial layer 171, the material layer 153 and the conductive layer 151 being exposed from the mask patterns. Through this performing, the material layer 153 and the conductive layer 151 may therefore be patterned to form the conductive stacked structures 150 as shown in FIG. 6.

Precisely, each conductive stacked structure 150 includes patterned material layer 157 and patterned conductive layer 155, and the patterned conductive layer 155 is not only disposed in the openings 132, 134, but also conformally covering on the insulating stacked structure 130 at two sides of the openings 132, 134, to form two bilateral symmetric outer extension wings 155a, 155b. One of the conductive stacked structures 150 is formed at the left side of the substrate 100, between the two gate structures 110, so that, two sides of the one of the patterned conductive layers 155 may obtain a profile extending outwardly and upwardly from the opening 132, thereby forming the outwardly and upwardly extended outer extension wings 155a, as shown in FIG. 6. On the other hand, another one of the conductive stacked structures 150 is formed at the right side of the substrate 100, being formed on the gate layer 113 of the gate structure 110, so that, two sides of the another one of the patterned conductive layers 155 may obtain a profile extending outwardly and downwardly from the opening 134, thereby forming the outwardly and downwardly extended outer extension wings 155b. In the present embodiment, according to the forming position of each conductive stacked structure 150, the outer extension wings 155a, 155b formed at the two sides thereof may both obtain the same height and mirror relative shapes, as shown in FIG. 6, but not limited thereto.

Figure 7:
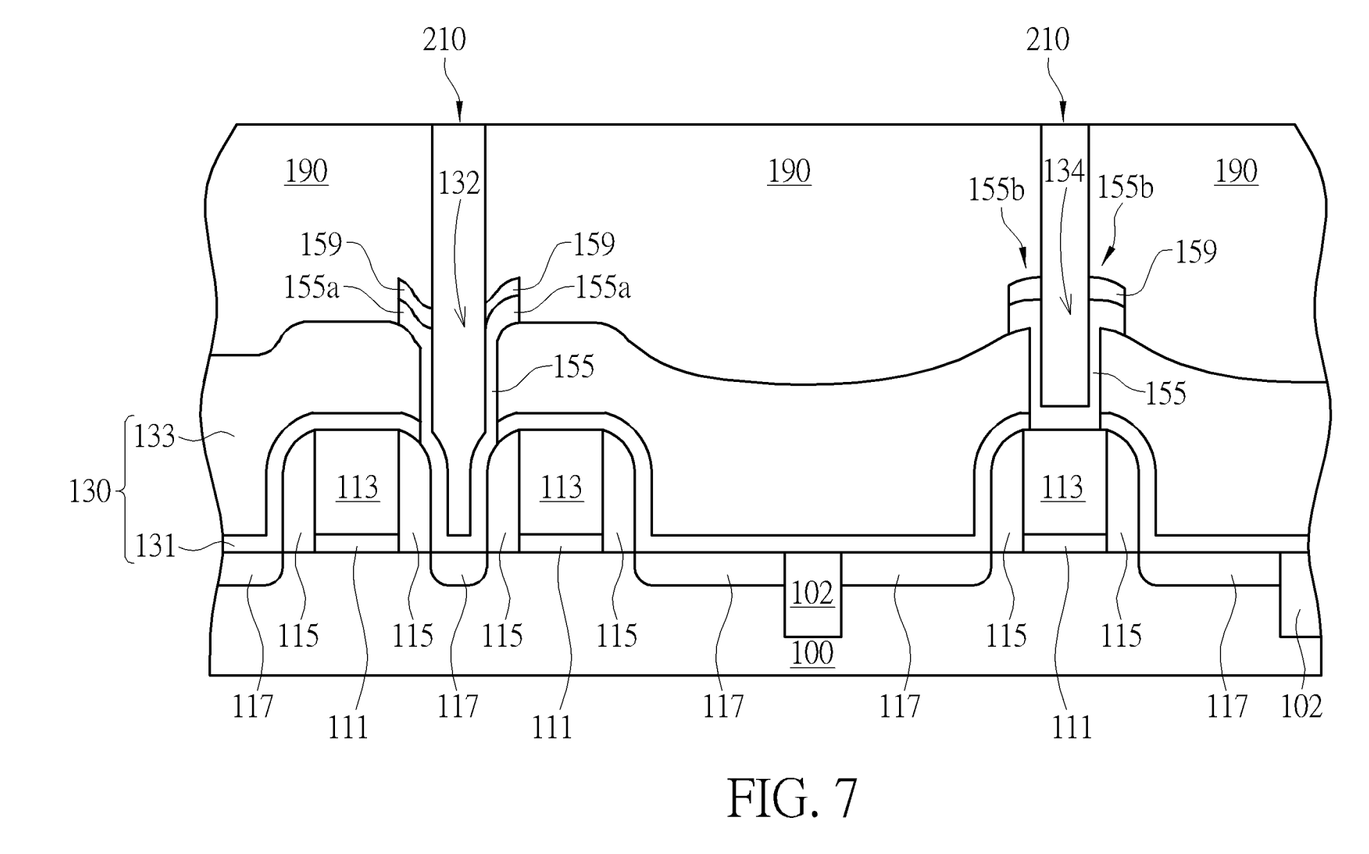
FIG. 7 shows a cross-sectional view of a semiconductor device after forming a plug.

Following these, an interlayer dielectric layer 190 is formed on the substrate 100, and plugs 210 which are in connection with openings 132, 134 are formed in the interlayer dielectric layer 190. Precisely, the interlayer dielectric layer 190 for example include a dielectric material like silicon oxide, and which flatly covers the conductive stacked structures 150 and the insulating stacked structure 130, to fill up the openings 132, 134. Then, a plurality of plug openings (not shown in the drawings) is formed in the interlayer dielectric layer 190 to in connection with the openings 132, 134, and the plugs 210 are formed in the plug openings respectively. It is noted that, while forming the plug openings, the material layer 157 filled in the openings 132, 134 is further removed as removing the interlayer dielectric layer 190 within the openings 132, 134, so as to expose the conductive layer 155 underneath. Through this performing, the plugs 210 formed subsequently may be electrically connected to a particular source/drain region 117 or a particular gate layer 113 through the conductive layer 155, as shown in FIG. 7. Meanwhile, after forming the plug openings, the material layer 157 is still partially remained on the outer extension wings 155a, 155b, to form a dielectric layer 159 only sandwiched between each plug 210 and the outer extension wings 155a, 155b, with two sides thereof being vertically aligned with the two sides of the conductive layer 155, as shown in FIG. 7.

According to the aforementioned steps, the method of forming a semiconductor device of the first preferred embodiment is completed. In the forming process of the present embodiment, the conductive layer 155 formed through a pre-plug process is configured as a portion of the interconnection system of the semiconductor device, so as to significantly shrink the cell size of the semiconductor device, for example in about 20% or more than 20% shrinkage in comparison with the size of a conventional layout. Based on the process of the present embodiment, the corresponding insulating stacked structure 130 and the corresponding conductive stacked structure 150 are formed according to the semiconductor device with shrunk layout, to improve the possible impacts of the plug forming process especially on the process window thereof. Also, through disposing the conductive stacked structure 150, the dielectric layer 159 is additionally formed between each plug 210 and each of the outer extension wings 155a, 155b, so as to avoid any possible short circuit between each outer extension wings 155a, 155b extended from the conductive layer 155 and other elements. Thus, the method of the present embodiment not only has advantage to form the plug 210 in the semiconductor device with shrunk layout, but also enables the formed plug 210 to obtain an improved structure.

People skilled in the arts may fully understand that the method of the present invention is not limited to be achieved through the aforementioned process, and also include other process. For example, although the conductive layer 151 of the aforementioned embodiment is formed in a monolayer structure, the conductive layer formed in practical operation may also include a multilayer structure (not shown in the drawings) for example having a barrier layer (not shown in the drawings) and a conductive material layer (not shown in the drawings), with the barrier layer including titanium (Ti)/titanium nitride (TiN) and with the conductive material layer including a low resistant metal like tungsten. Otherwise, in another embodiment, the material layer 153 may also be omitted to make the conductive stacked structure being consisted of the barrier layer and the conductive material layer, so that, a plug may be directly formed in the subsequent process by optionally not removing or partially removing the barrier layer and/or the conductive material layer within the openings 132, 134. The following description will detail the different embodiments of the method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
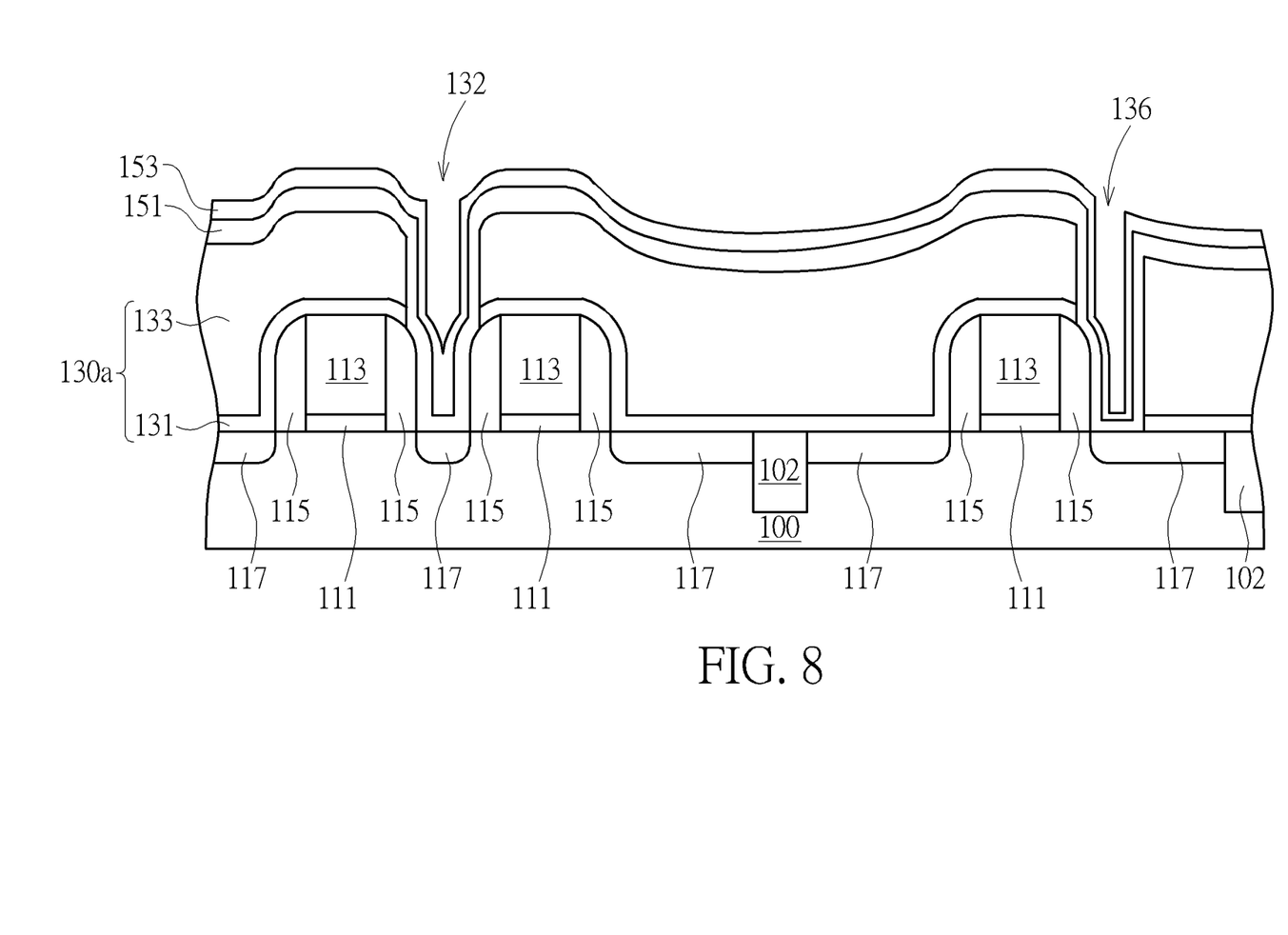
FIG. 8 shows a cross-sectional view of a semiconductor device after forming an insulating stacked structure.
Figure 9:
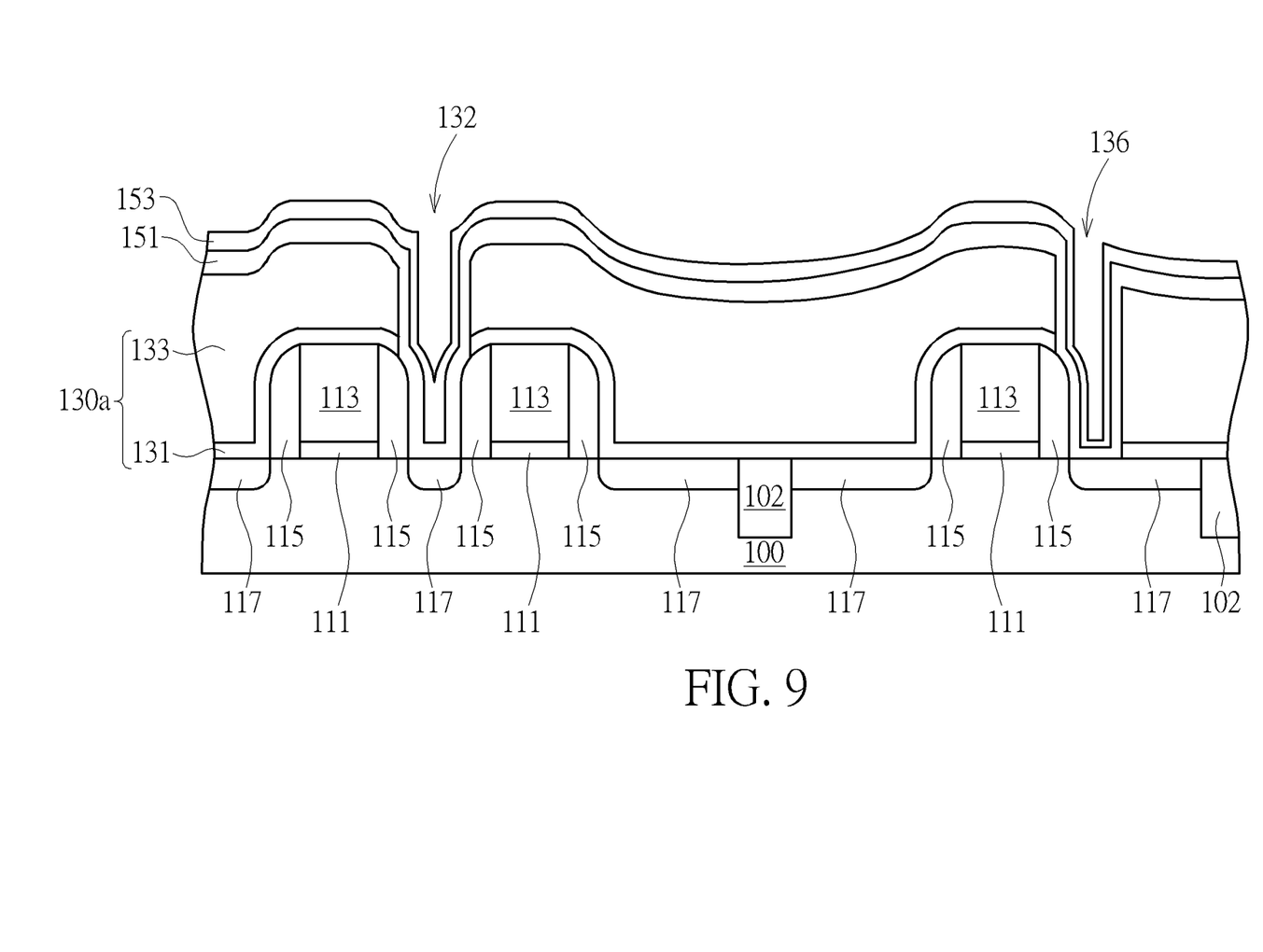
FIG. 9 shows a cross-sectional view of a semiconductor device after forming a conductive layer.
Figure 10:
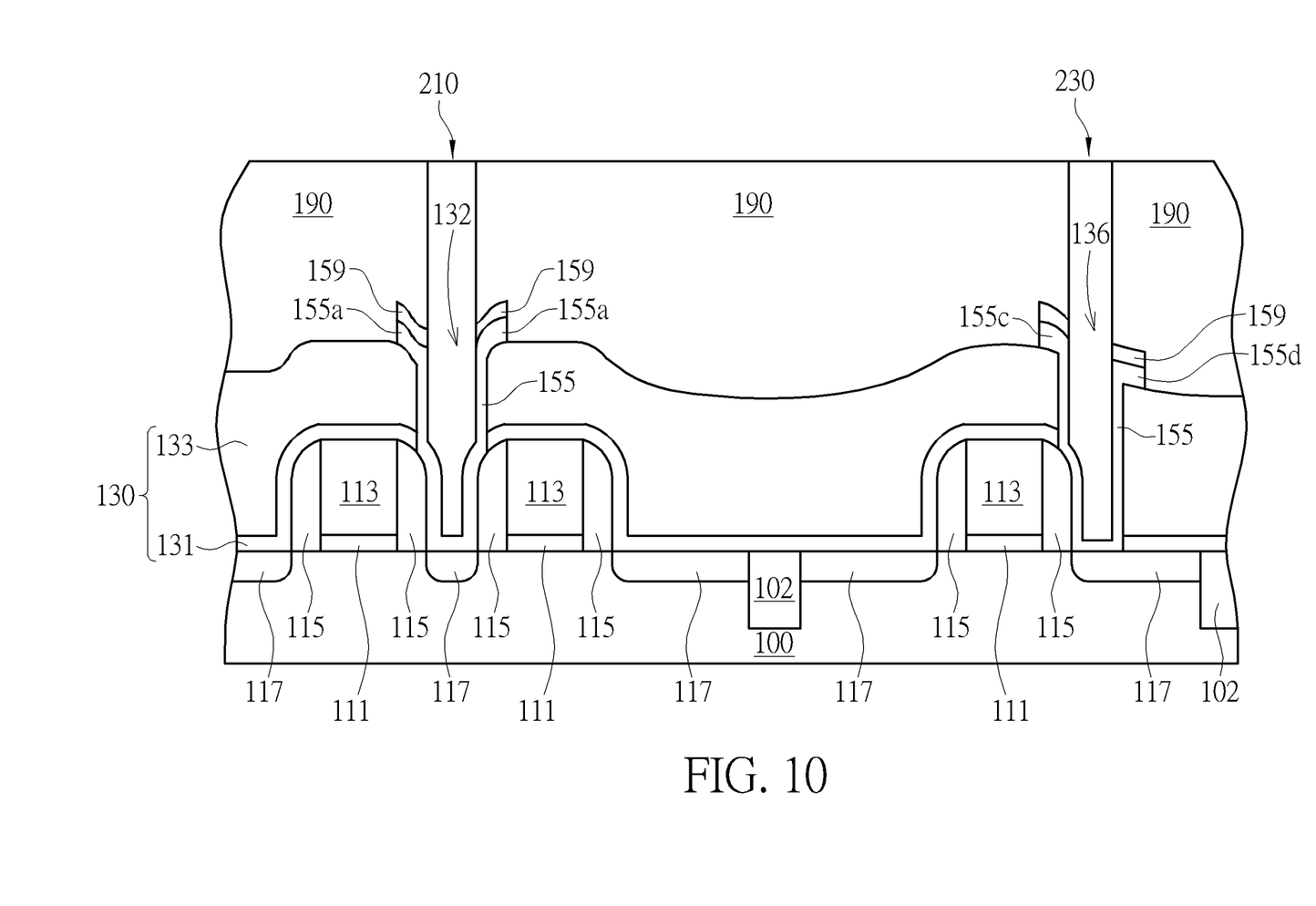
FIG. 10 shows a cross-sectional view of a semiconductor device after forming a plug.

Please refer to FIGS. 8-10, which are schematic diagrams illustrating a forming process of a semiconductor device according to the second embodiment of the present invention. The formal steps in the present embodiment are similar to those in the first embodiment, and which will not redundantly described herein. The differences between the present embodiment and the aforementioned first embodiment are that, openings 132, 136 defined by an insulating stacked structure 130a of the present embodiment is designed by optionally exposing the shared source/drain region 117 between the two gate structures 110 at the left side of the substrate 100, and exposing a portion of the gate structure 110 and the source/drain region 117 at a side thereof at the right side of the substrate 100, as shown in FIG. 8.

Next, the conductive layer 151 and the material layer 153 are sequentially formed on the insulating stacked structure 130a, to conformally cover surfaces of the insulating stacked structure 130a and the openings 132, 136, so that, surfaces of the conductive layer 151 and the material layer 153 may also obtain an uneven profile as shown in FIG. 9. Then, the processes as shown in FIGS. 5-7 of the aforementioned first preferred embodiment are continuously performed, to obtain plugs 210, 230, a dielectric layer 159 and a conductive layer 155 as shown in FIG. 10

In the present embodiment, the conductive layer 155 may also form corresponding outer extension wings 155a, 155c, 155d due to the forming position thereof. Since a portion of the conductive layer 155 which is formed in the opening 132 and two sides thereof is disposed on the shared source/drain region 117 between the two gate structures 110, the outer extension wings 155a formed at two sides thereof may therefore extend outwardly and upwardly according to the profile of the insulating stacked structure 130a underneath, as shown in FIG. 10. Also, the dielectric layer 159 is sandwiched between each plug 210, 230 and each outer extension wings 155a at the two sides of the said portion of the conductive layer 155. On the other hand, another portion of the conductive layer 155 which is formed in the opening 136 and two sides thereof is disposed on the gate structure 100 and the source/drain region 117 at a side thereof, the outer extension wing 155c at one side may extend outwardly and upwardly and the outer extension wing 155d at another side may extend outwardly and downwardly, both according to the profile of the insulating stacked structure 130a underneath. Through this performance, the said another portion of conductive layer 155 may therefore obtain two asymmetric outer extension wings 155c, 155d which are in different heights, different extending directions and profiles, as shown in FIG. 10.

According to the aforementioned steps, the method of forming a semiconductor device of the second preferred embodiment is completed. In the forming process of the present embodiment, the conductive layer 155 formed through a pre-plug process is also configured as a portion of the interconnection system of the semiconductor device. Based on the process of the present embodiment, the corresponding insulating stacked structure 130a and the corresponding conductive stacked structure 150 are formed according to the semiconductor device with shrunk layout, to improve the possible impacts of the plug forming process especially on the process window thereof. Also, through disposing the conductive stacked structure 150, the dielectric layer 159 is additionally formed between each plug 210, 230 and each of the outer extension wings 155a, 155c, 155d, for avoid the short circuit issues between each outer extension wings 155a, 155c, 155d extended from the conductive layer 155 and other elements. Thus, the method of the present embodiment not only has advantage to form the plugs 210, 230 in the semiconductor device with shrunk layout, but also enables the formed plugs 210, 230 to obtain an improved structure.

Figure 11:
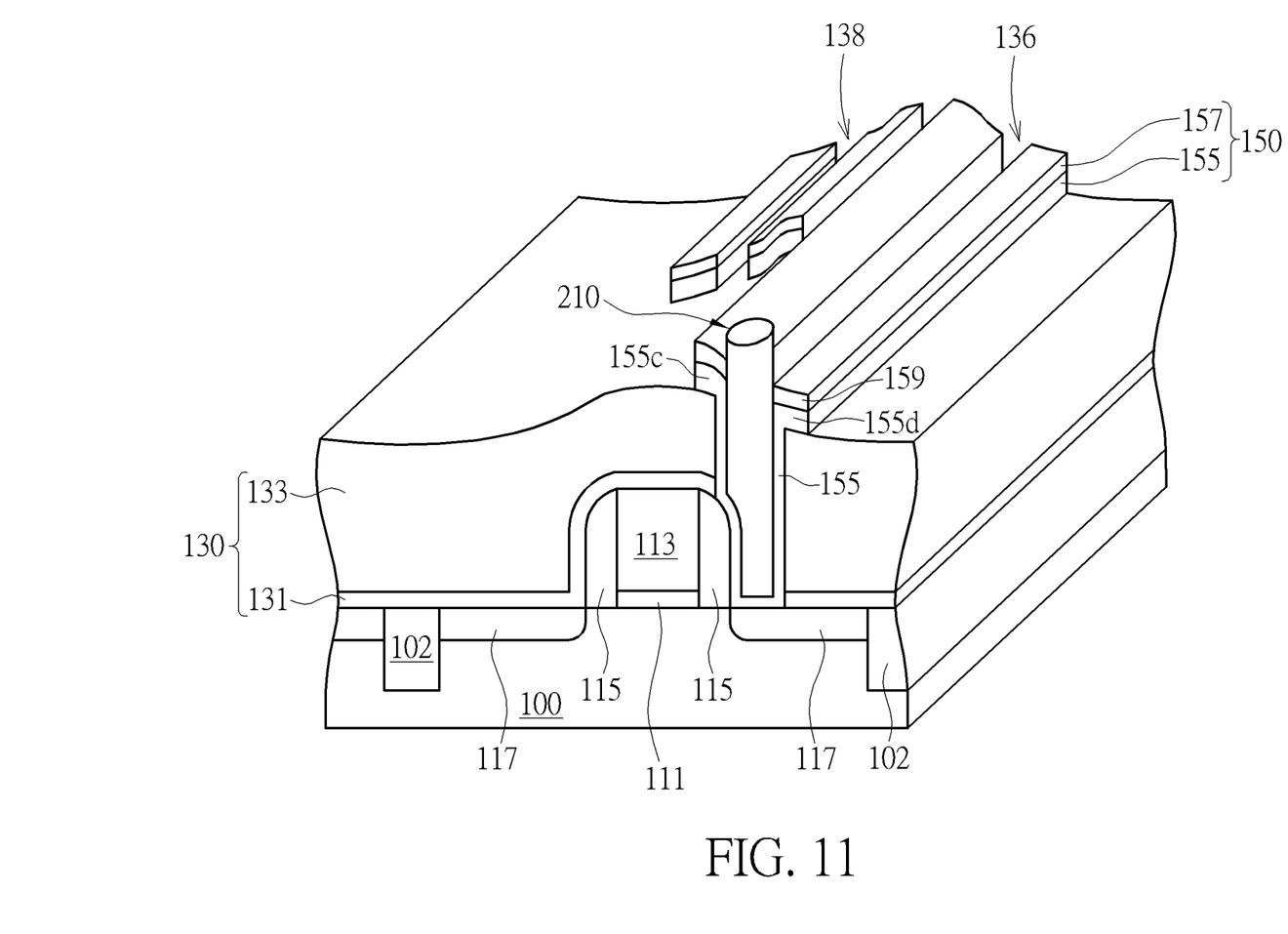
FIG. 11 is a schematic diagram illustrating a three-dimension view of a semiconductor device according to another preferred embodiment of the present invention.
Figure 12:
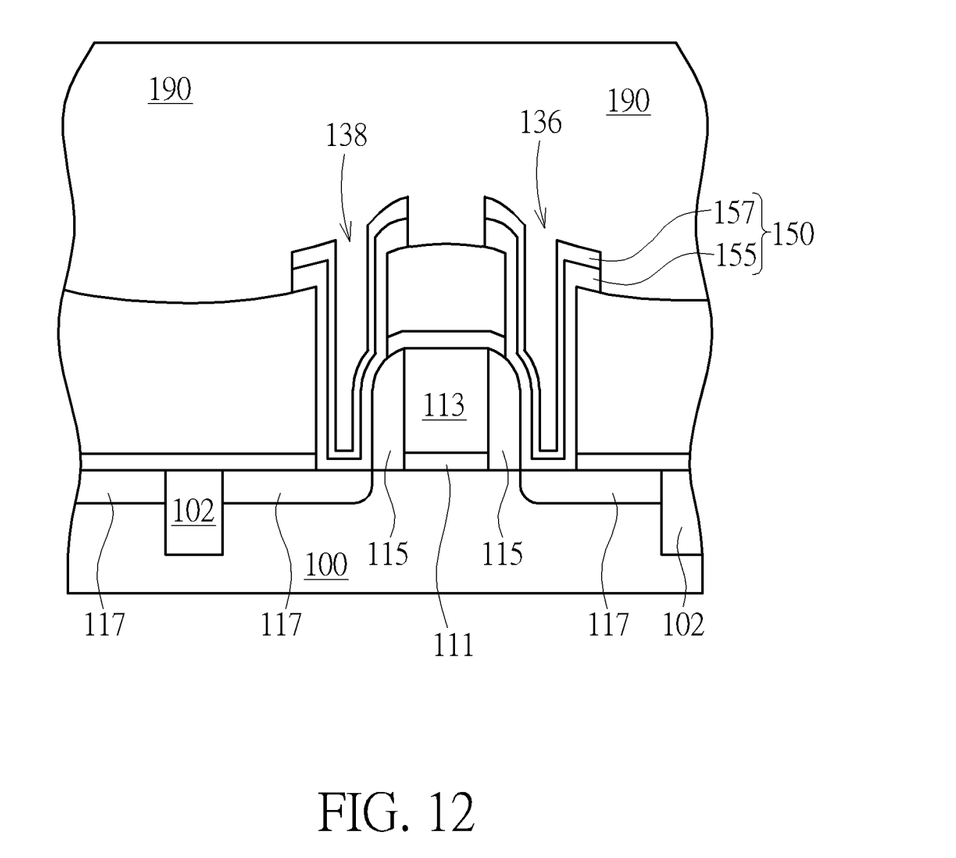
FIG. 12 is a schematic diagram illustrating a cross-sectional view of a semiconductor device according to another preferred embodiment of the present invention.

In additional, people well skilled in the art should easily realize that the disposed positions of each opening 132, 134, 136 and the conductive stacked structure 150 shown in the aforementioned embodiment are only for example, and not limited thereto. According to the requirements of the practical product, the conductive stacked structure and the openings may have other settings or changes depending on the connection relationship of the elements in the semiconductor device. Also, the disposing of the conductive stacked structure is mainly to establish a preliminary interconnection system between some particular elements of semiconductor device, so that, openings and a conductive stacked structure formed at two opposite ends of the same gate structure 110 may have different exposing region and profile thereby. For example, as shown in FIG. 11, the conductive stacked structure 150 disposed at one end of the gate structure 110 may include a structure shown at the right side of FIG. 10, and which may be electrically connected to a metal line (not shown in the drawings) or other elements (not shown in the drawings) formed subsequently through the plug 230. The openings 136, 138 formed at another end of the same gate structure 110 may be designed to optionally expose a portion of the gate structure 100 and the source/drain regions 117 at two sides thereof, for example including a structure as shown in FIG. 12. Thus, the conductive stacked structure 150 formed in the openings 136, 138 may further extend to other elements such as a source/drain region of another gate structure (not shown in the drawings) of the semiconductor device, so that, only a single plug such as the plug 230 is required to be formed to electrically connect the gate structure 110 as shown in FIG. 11 to other gate structures. Under such arrangement, it is unnecessary to form any other plug in connection with the openings 136, 138 and the conductive stacked structure 150 at the another end of the gate structure 110, as shown in FIG. 12. Thus, the entire layout of the semiconductor device is significantly shrunk thereby, for example being shrunk by about 20% or more than 20%.

Overall speaking, since the semiconductor device of the present invention utilizes a pre-plug conductive layer to form a preliminary interconnection system, the cell size of the semiconductor may be sufficiently shrunk. Also, the present forming process of the present invention further improve the plug forming process under such semiconductor device with shrunk layout, which may not only avoid the possible impacts of the plug forming process especially on the process window thereof, but also has advantages to form plugs with a preferable structure, so as to obtain a more reliable semiconductor device thereby.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
   a substrate;
   a gate structure disposed on the substrate;
   an insulating stacked structure, partially covering the gate structure and the substrate to expose a portion of the gate structure to define a first opening, wherein a portion of the substrate at one side of the gate structure is further exposed from the first opening; and
   a first conductive layer, covering surfaces of the first opening to directly contact the portion of the gate structure, wherein the first conductive layer comprises two outer extension wings disposed on a top surface of the insulating stacked structure, and the two outer extension wings have non-planar top surfaces.
2. The semiconductor device according to claim 1, wherein the two outer extension wings are respectively extended outwardly and downwardly from the first opening.
3. The semiconductor device according to claim 1, further comprising:
   a dielectric layer, only covering the two outer extension wings of the first conductive layer; and
   a plug, disposed in the first opening, with the dielectric layer being sandwiched between the plug and the two outer extension wings.
4. The semiconductor device according to claim 3, wherein two sides of the first conductive layer are vertical aligned with two sides of the dielectric layer.
5. The semiconductor device according to claim 3, further comprising:
   an interlayer dielectric layer disposed on the gate structure, wherein the interlayer dielectric layer covers the plug, the dielectric layer, the first conductive layer and the top surface of the insulating stacked structure.
6. The semiconductor device according to claim 1, wherein the insulating stacked structure comprises a first insulating layer and a second insulating layer stacked one over another on the substrate.

7. The semiconductor device according to claim 6, wherein a thickness of the second insulating layer is about 5 to 8 times greater than that of the first insulating layer.

8. The semiconductor device according to claim 6, wherein the first insulating layer and the second insulating layer have different materials.

9. The semiconductor device according to claim 1, wherein the two outer extension wings are asymmetric and have different heights.

10. The semiconductor device according to claim 1, wherein one of the two outer extension wings is extended outwardly and downwardly from the first opening, and another one of the two outer extension wings is extended outwardly and upwardly from the first opening.

11. The semiconductor device according to claim 1, further comprising:
   another gate structure, paralleled disposed with the gate structure on the substrate, wherein a second opening is further defined in the insulating stacked structure, between the gate structure and the another gate structure, to expose a portion of the substrate between the gate structure and the another gate structure; and
   a second conductive layer, covering surfaces of the second opening to directly contact the portion of the substrate between the gate structure and the another gate structure.

12. The semiconductor device according to claim 11, wherein the second conductive layer comprises two outer extension wings on the top surface of the insulating stacked structure, and the two outer extension wings of the second conductive layer are in a same height.

\* \* \* \* \*